United States Patent [19]

Swanson

[11] 3,710,205

[45] Jan. 9, 1973

[54] ELECTRONIC COMPONENTS HAVING IMPROVED IONIC STABILITY

[75] Inventor: John G. Swanson, Monroeville, Pa.

[73] Assignee: Westinghouse Electric Corporation, Pittsburgh, Pa.

[22] Filed: April 9, 1971

[21] Appl. No.: 132,643

[52] U.S. Cl..........317/234 R, 317/234 F, 317/235 B, 317/235 F, 317/235 AG, 117/201

[51] Int. Cl.............................H01l 11/14, H01l 1/10

[58] Field of Search.....317/234 F, 235 B, 235 F, 235 AG

[56] References Cited

UNITED STATES PATENTS

| | | | |
|---|---|---|---|
| 3,632,432 | 1/1972 | Swanson | 117/201 |
| 3,535,133 | 10/1970 | Akhtar | 106/53 |
| 3,441,422 | 4/1969 | Graff | 106/53 |
| 3,282,711 | 11/1966 | Lin | 106/39 |
| 2,920,971 | 1/1960 | Stookey | 106/39 |

OTHER PUBLICATIONS

Lehman et al., I.B.M. Technical Discl. Bull., Vol. 8, No. 4, Sept. 1965, pages 675–676.

*Primary Examiner*—Martin H. Edlow
*Attorney*—F. Shapoe and C. L. Menzemer

[57] ABSTRACT

This disclosure is concerned with electronic components having improved ionic stability. The improved stability is achieved by the doping of silicon oxide films and layers in the component. Suitable doping materials are selected from a group of material having divalent large ionic radii atoms.

6 Claims, 14 Drawing Figures

ELECTRONIC COMPONENTS HAVING IMPROVED IONIC STABILITY

GOVERNMENT CONTRACT

This invention was made under NASA Contract NAS5-21011.

BACKGROUND OF THE INVENTION

1. Field of the Invention

This invention is concerned with electronic components in general, including thin film transistors, discrete power devices and integrated circuits. This invention finds application wherever silicon oxide is used as an electrical insulator or passivator.

2. Description of the Prior Art

In thin film devices, such as for example as field effect transistors, silicon oxide is employed as an electrical insulator as for example to insulate the gate electrode from the film of semiconductor material.

Such devices frequently exhibit ionic instability due to the migration of impurity ions through the silicon oxide layer between the gate electrode and film of semiconductor material.

In discrete semiconductor devices such for example, diodes, transistors, and four-region switches, and in integrated circuit devices, especially planar type structures, it is customary to passivate p-n junctions with a first layer of silicon oxide and a second layer of silicon nitride. The second layer, the silicon nitride layer, is required because ions will pass through the silicon oxide layer.

An object of this invention is to provide a thin film electronic component having improved ionic stability.

Another object of the present invention is to provide a new p-n passivation material for discrete semiconductor and integrated circuit device.

SUMMARY OF THE INVENTION

In accordance with the present invention there is provided a semiconductor device comprising a body of silicon oxide doped with a divalent material having an atomic radii of at least 0.9 A disposed on at least one surface of a body of semiconductor material.

BRIEF DESCRIPTION OF THE DRAWINGS

For a better understanding of the nature and objects of the invention, reference should be had to the following detailed description and drawing, in which.

DESCRIPTION OF PREFERRED EMBODIMENTS

Figure 1:
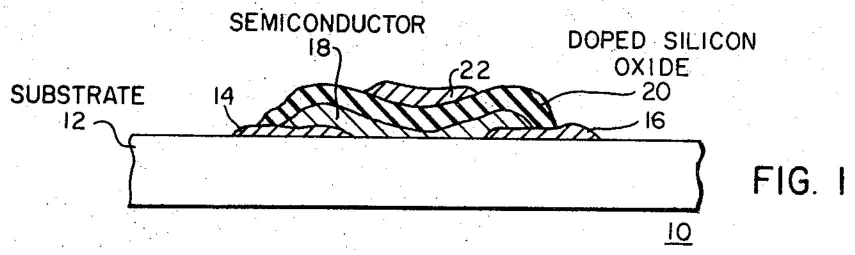
FIGS. 1 and 2 are side views in cross-section, of semiconductor devices incorporating the teachings of this invention.

With reference to FIG. 1, there is shown a thin film field effect transistor 10 on a substrate as one illustrative embodiment of the teachings of this invention and made in accordance with the procedures of this invention.

The transistor 10 consists of a substrate 12, a source contact or electrode 14, a drain contact or electrode 16, a layer of semiconductor material 18, a layer of doped silicon oxide electrical insulation 20 and a gate contact or electrode 22.

The substrate 12 may be rigid or flexible.

Suitable rigid substrate materials are glasses, ruby, alumina oxide and ceramics.

If a flexible substrate is desired, suitable materials include for example, paper, polyethylene terephthlate sold commercially under the trademark Mylar; esters and ethers of cellulose such as ethyl cellulose; cellulose acetate; and cellulose nitrate; regenerated cellulose such as cellophane; polyvinyl chloride; polyvinyl chloride-acetate; polyvinulidene chloride, sold commercially under the trademark Saran; nylon film polyimide and polyamide-imide film, polyterrafluoroethylene, sold commercially under the trademark Teflon, polytrifluoromonochloroethylene, sold commercially under the trademark Kel F; and flexible tapes and foils of the metals: nickel, aluminum, copper, tin, tantalum and base alloys of any of these, and ferrous base alloys such for example as thin gauge stainless steel strip.

The paper may be of any type and surface texture, either rough or smooth, as for example, rag paper, wood pulp paper, alpha cellulose paper, kraft paper and the like. As illustrations, the semiconductor devices of this invention have been produced with playing cards, writing stationery, and newspaper as the substrate.

The term "flexible", as used in describing the substrate, means a material that can be wrapped around a mandrel of, at the maximum, 1 inch in diameter and preferably a mandrel of the order of one-eighth inch in diameter using such flexible substrates having FET's of the type shown in FIG. 1, they have been bent into radii as small as one-sixteenth inch without degradation of operating characteristics. Any less flexible materials are considered rigid for purposes of this invention.

Figure 2:
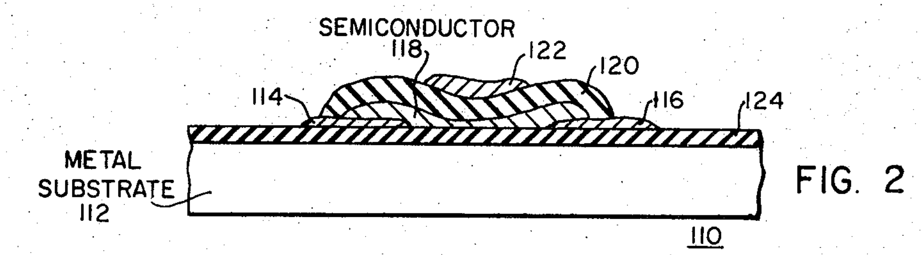

With reference to FIG. 2, there is shown a modified FET device 110. When the flexible substrate 112 of the device 110 is a flexible metal foil or tape, a layer 124 of an electrically insulating material, to insulate the electronic functioning components of the device from the substrate, is disposed on the substrate 112 before the device is fabricated.

Depending on the metal comprising the substrate, the insulation layer 124 may be an anodic oxide of the tape metal itself, as for example, aluminum oxide if the metal substrate 112 is aluminum, or the insulation may be any of the cured electrically insulating resinous materials which are used as insulators on electrically conductive wire such for example as polyvinyl formed phenolic resins sold under the trademark Formex, epoxy resins including mixtures with polyamides-imides and polyimide resins such as are set forth in U.S. Pats. Nos. 3,179,630 and 3,179,635.

The teachings of this invention are equally applicable to devices on either rigid or flexible substrates.

With reference again to FIG. 1, but equally applicable to FIG. 2, the source 14 and drain 16 are disposed upon the flexible substrate 12 or upon the insulation layer 124 of the substrate 112 and spaced apart from each other. The distances between the source and drain is not critical and depends on the properties desired. The source electrode 14 and drain electrode 16 may be of any suitable electrically conductive metal, such as a metal selected from the group consisting of gold, silver, aluminum, nickel and base alloys thereof. The source electrode 14 and drain electrode 16 should have a thickness sufficient to insure their functioning as ohmic contacts. A thickness of from 80 A to 500 A and preferably from 100 A to 300 A has been found satisfactory for most devices.

The layer of semiconductor material 18 extends between the source electrode 14 and drain electrode 16 and is in contact with the source electrode 14 and drain electrode 16. Preferably the layer 18 partially overlaps the source 14 and drain 16. The layer 18 may consist of any semiconductor material, such for example, as tellurium, cadmium sulfide, cadmium selenide, silicon, indium arsenide, gallium arsenide, tin oxide and lead telluride. The layer 18 may be single crystal, Polycrystalline or amorphous.

The thickness of the semiconductor layer 18 may vary from an average thickness of 40 A for tellurium to several thousand angstroms for the wider band gap materials such as cadmium sulfide and cadmium selenide.

The electrical insulation layer 20 does not have to completely cover layer 18 of semiconductor material, it need only electrically insulate the gate electrode 22 from the semiconductor layer 18.

The electrical insulating layer 20 consists of silicon oxide doped with from 0.1 percent to 20 percent, by volume, and preferably from 0.5 percent to 5 percent, by volume, of at least one material which is divalent and has an ionic radii of at least 0.9 A. A suitable material for doping layer 20 is at least one material selected from the group consisting of barium, lead, strontium, calcium and oxides thereof.

If the doping level is below 0.1 percent, by volume, any improvement in device performance is minimal. If the doping level is above 20 percent, by volume, the electrical properties of the device may be adversely effected.

The electrical insulating layer 20 should be as thin as possible so that modulation can be produced in the device current at a relatively low voltage. However, the layer must serve as an adequate electrical insulator. A layer of 100 A has occasionally been found to contain pin holes which adversely effect the electrical insulation function of the layer. A thickness of about 300 A appears to be the minimum thickness which will ensure that there are no pin holes while 1,000 A appears to be the optimum between a void free insulation layer and low voltage modulation. As the operating voltage of the device increases to 100 volts, a thickness of about 3,000 A is desirable and at an operating voltage of 200 volts a thickness of about 5,000 A to 6,000 A is desirable.

The gate electrode 22 is disposed on the doped silicon oxide insulation layer 20 between the source electrode 14 and the drain electrode 16.

The gate electrode 22 consists of a good electrically conductive metal such as a metal selected from the group consisting of aluminum, copper, tin, silver, gold and platinum. In order to ensure that the gate electrode 22 provides a high conductivity, it should have a thickness of from 300 A to 1,000 A and preferably from 500 to 1,000 A.

The manner in which the teachings of this invention improve the operation of a semiconductor device of any type having a layer of silicon oxide is believed to be as explained below.

Figure 3:
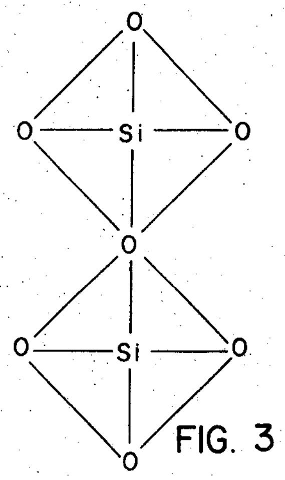
FIGS. 3 and 4 are schematic diagrams showing atomic arrangements in silicon oxide layers.

The structure of silicon oxide is thought to be a random network of $SiO_4$ tetrahedra as shown in FIG. 3. The $Si0_4$ molecules are linked to each other at corners. In low density silicon oxide deposits some of the corner oxygen atoms are not bonded and the random network has large interstices, formed by the unbonded oxygen atoms, which line up to form open channels through which contaminate ions may migrate. A typical contaminant ion is sodium.

Figure 4:
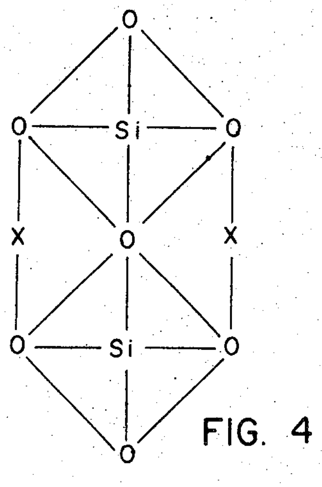

The doping of the silicon oxide with a divalent atom having a large, relative to the contaminant, ionic radii closes off these interstices as shown in FIG. 4, wherein X represents a divalent atom having an ionic radii of at least 0.9 A. Divalent atoms having an ionic radii of less than 0.9 A have been found to have such a small blocking effect as to be impractical.

Figure 5:
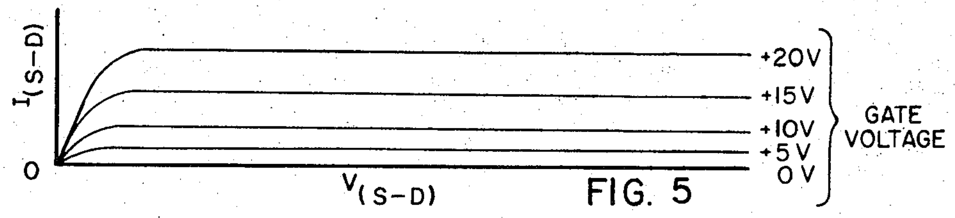
FIGS. 5 and 6 are I-U characteristic plots of FET devices.
Figure 6:
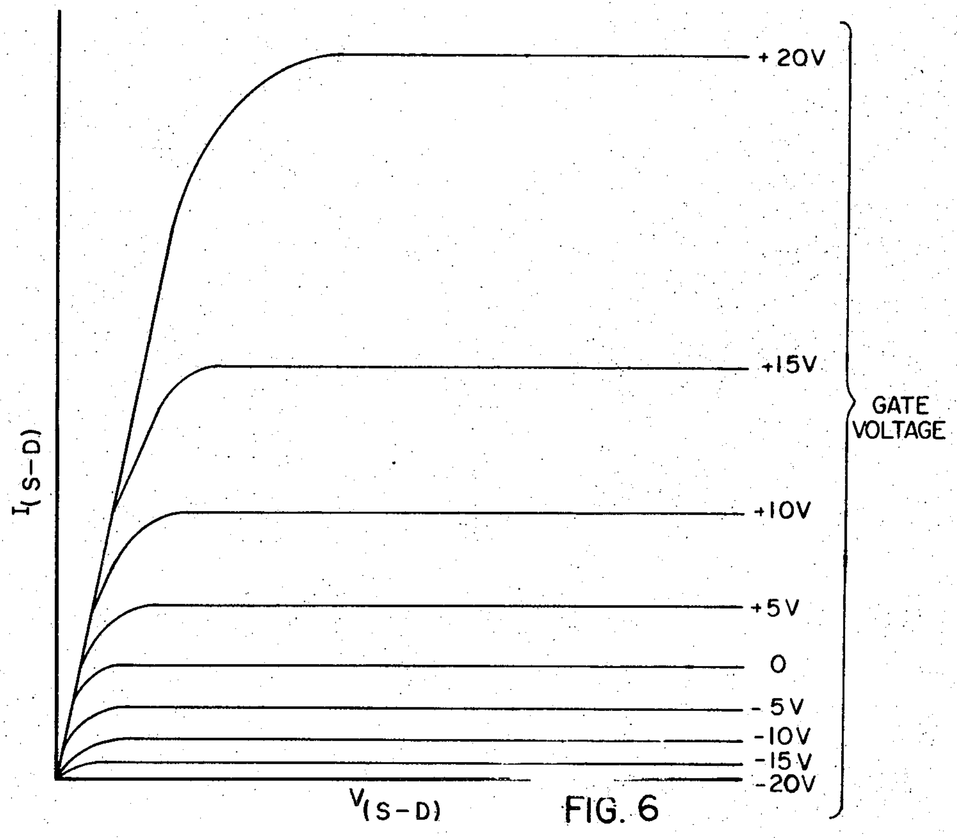

The effect of contaminant ion migration on a field effect transistor can be shown with reference to FIGS. 5 and 6.

FIG. 5 shows a plot of source-drain current ($I_{S-D}$) versus source-drain voltage ($V_{S-D}$) at various gate voltages for an ideal field effect transistor.

As can be seen from FIG. 5, in an ideal device the flat band voltage is zero, that is at a zero gate voltage there is no current flow between the source and drain.

FIG. 6 shows what happens in for example, an n-type channel device under a positive gate voltage when positive contaminate ions in the gate insulation move through the gate insulation layer toward the semiconductor layer. Current continues to flow between the source and drain even after the positive gate voltage is removed and a negative voltage, of for example as much as 20 volts, must be put on the gate to shut the device off.

Comparable adverse results occur in p-type channel devices due to contaminate ion migration.

By the use of the doped gate insulation layer of this invention ideal device characteristics can be approached.

It should be noted that most contaminate ions are positive and mobile, while any negative ions are relatively immobile and can and are ignored by device designers.

To further illustrate the advantages of this invention, four n-type silicon wafers having a thickness of about 10 mils were prepared.

Wafer No. 1 had a 1,000 A thick thermally grown oxide layer grown on its upper surface.

Wafer No. 2 had a 1,000 A thick vacuum evaporated layer of silicon oxide deposited on its upper surface.

Wafer No. 3 had a 1,000 A thick silicon oxide layer doped with 0.7 percent, by volume, BaO deposited on its upper surface.

Wafer No. 4 had a 1,000 A thick silicon oxide layer doped with 0.9 percent, by volume, Pb deposited on its upper surface.

Aluminum contacts were affixed to each of the upper surfaces of the silicon oxide layers. The aluminum contacts were all of the same size and area.

A varying voltage was applied between the aluminum contact and the silicon while measuring the capacitance of the silicon oxide layer.

Figure 7:
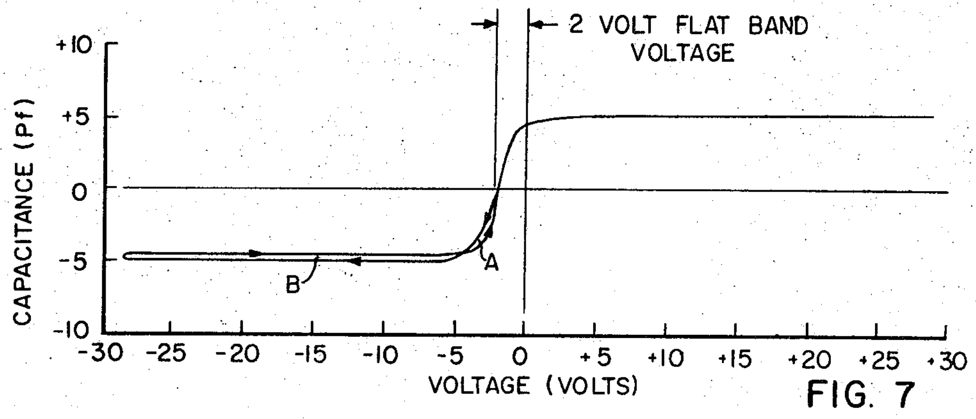
FIGS. 7 to 10 are voltage-capacitance curves of various silicon oxide layers.

FIG. 7 shows the plot of voltage-capacitance for wafer No. 1 having the layer of thermally grown silicon oxide on the silicon wafer.

It will be noted that the thermally grown oxide exhibited a small hysteresis at points denoted A and B. The hysteresis at point A is small, is a counterclockwise hysteresis and is caused by contaminate ion migration. The hysteresis at point B is clockwise and is caused by charge trapping. The structure shows a flat band voltage of minus 2 volts.

Figure 8:
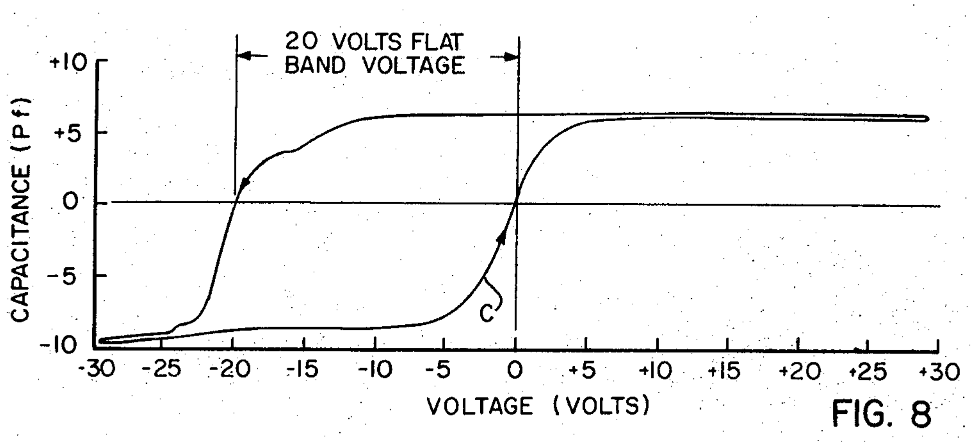

FIG. 8 shows the plot of voltage-capacitance for wafer No. 2 having the layer of vacuum deposited silicon oxide on the silicon wafer.

It will be noted that the vacuum deposited silicon oxide exhibits a large hysteresis at C. The hysteresis is counterclockwise hysteresis and is caused by contaminate ion migration.

When the voltage is applied between the aluminum contact and the silicon in this structure, the flat band voltage is zero. The voltage was then, as shown by the curve, increased up through +30 volts and then back through zero into the negative range. The point of infliction occurs at point D, −20 volts. The flat band voltage shifted by 20 volts from zero to −20 volts. This change in flat band voltage has resulted from stressing the oxide layer with 30 volts. Such a change in the operating parameters of the structure is highly undesirable.

Figure 9:
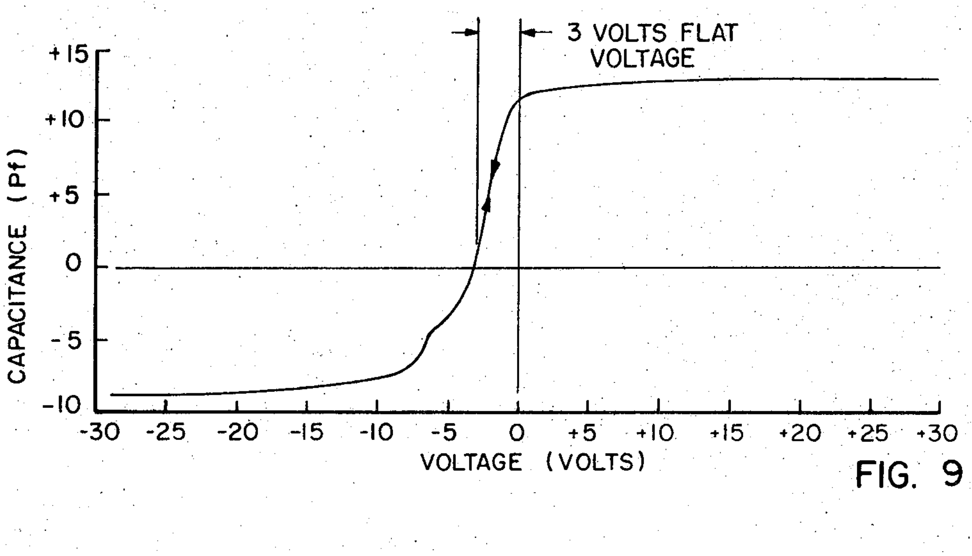

FIG. 9 shows the plot of voltage-capacitance for wafer No. 3 having the layer of vacuum deposited silicon oxide doped with 0.7 percent, by volume, BaO, in accordance with the teachings of this invention on the silicon wafer.

It will be noted that in the voltage-capacitance curve that this structure was entirely free of any hysteresis and that the flat band voltage was only 3 volts.

A comparison of FIGS. 8 and 9 shows clearly the improvement realized when a silicon oxide is doped in accordance with the teachings of this invention.

Figure 10:
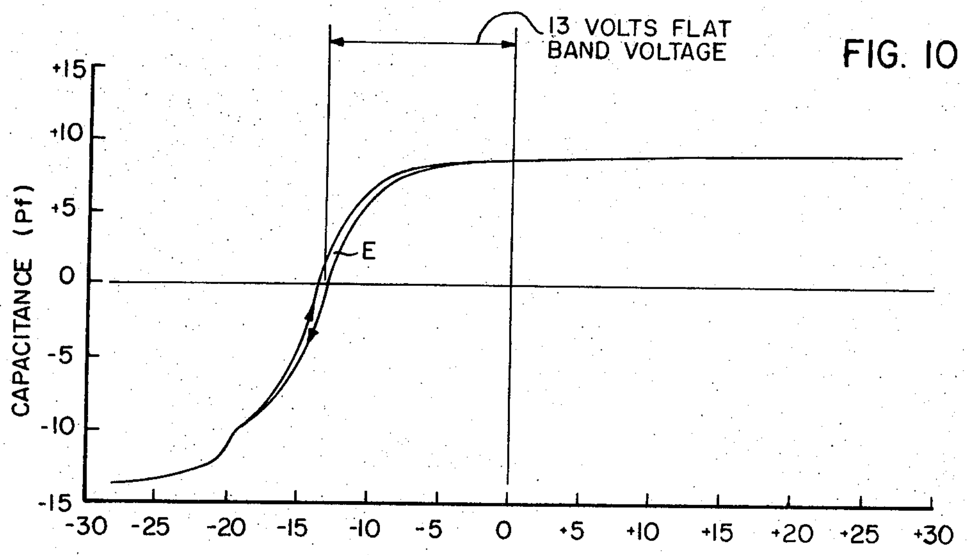

FIG. 10 shows the plot of voltage-capacitance for wafer No. 4 having the layer of vacuum deposited silicon oxide doped with 0.9 percent, by volume, Pb, in accordance with the teachings of this invention, on the silicon wafer.

It will be noted that a small amount of hysteresis was found, denoted at E, however, this was clockwise hysteresis and results from charge trapping and not from contaminate ion migration.

It will also be noted that while the flat band voltage was −13.5 volts it did not vary, as in FIG. 8 by more than 1 volt due to voltage stressing. The electrical characteristics of the device remain essentially stable even though it was stressed between +30 and −30 volts.

Again this is a clear showing of the improvement realized in practicing the teachings of this invention.

While it is apparent from FIGS. 7 and 9, that thermally grown silicon oxide gives a result substantially equal to that realized by practicing the teachings of this invention, it should be appreciated that a temperature of about 1,000°C is required to grow thermal silicon oxide. It is of course very impractical to heat thin film devices to such a high temperature.

The FET devices incorporating the teachings of this invention can be used for any application that does not require high power, very high frequency or high temperature. The devices have been used in cascade amplifiers, down-converter and oscillator circuits.

In preparing a device, in accordance with the teachings of this invention, the substrate, rigid or flexible, is disposed in a vacuum and the various materials to form the source and drain electrodes, the semiconductor material layer, the insulation layer and the gate contact are evaporated through a series of stencil masks onto the substrate.

The preparation of such devices on rigid substrates is well known to those skilled in the art. The preparation of such devices on flexible substrates is less well known and will be set forth therein below in detail. It should be understood however, that the discussion relating to preparing a device on flexible substrate is equally applicable with obvious exceptions to preparing devices on rigid substrates.

The material for the flexible substrate is selected and cut to size and shape. The versatility of the technique allows one to select a substrate of any size and shape desired. One preferred form is to employ a roll of substrate material with sprocket teeth disposed uniformly along its edge like photographic film.

If the substrate to be used is paper or a cellulose compound, it is cleaned by blowing dry nitrogen over it and baked in an oven for approximately 30 minutes at about 100°C.

If the substrate is an anodized metal foil or a cured resin coating on a metal foil, or any of the other suitable flexible materials listed above, the substrate is first washed in methanol, (or in another organic solvent if it happens to be soluble in methanol) dried with dry nitrogen, and baked in an oven for approximately 30 minutes at about 100°C.

In either case, the substrate is again cleaned off with dry nitrogen after removal from the oven.

Figure 11:
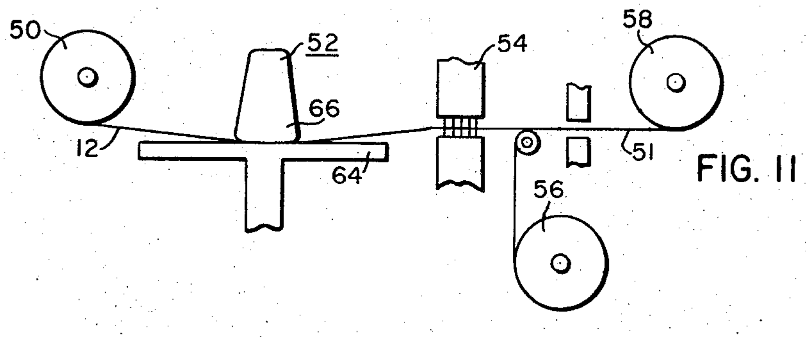
FIG. 11 is a schematic diagram of apparatus used in practicing the teachings of this invention.
Figure 12:
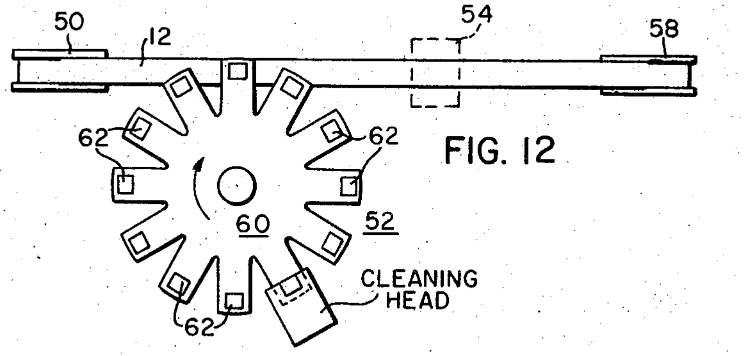
FIG. 12 is a top view-schematic diagram of a mask arrangement suitable for use in practicing the teachings of this invention.

With reference to FIGS. 11 and 12, the cleaned flexible substrate is then wound onto a feed reel 50, or other supply feed source, and disposed in a vacuum chamber.

By employing a leader 51 which may consist of a portion of the substrate itself or any other suitable material, such for example as a cellulose compound tape, the flexible substrate 12 is disposed between components of a deposition station 52, a test station 54, a sealing component station 56 and a take-up reel 58.

The vacuum chamber is then pumped down to a pressure of less than $10^{-5}$ torr and preferably less than $10^{-7}$ torr.

The flexible substrate 12 is then moved to bring into position an initial portion at the deposition station 52.

The deposition station 52 is comprised of a mechanical mask changing mechanism 60 upon which are positioned a series of masks 62, a thickness monitor 64, as for example, a microbalance, an optical monitor or a resistance monitor system and a mechanical shutter mechanism 66 which is employed to control the starting and stopping of the deposition.

As the first portion of the flexible substrate is positioned at the deposition station, the source and drain electrode mask is disposed over the substrate 12 and the source electrode 14 and drain electrode 16 (FIGS. 1 and 2) are vapor deposited on the substrate 12. The source electrode 14 and drain electrode 16 may consist of any metal selected from the group consisting of gold, silver, aluminum and nickel.

Satisfactory devices have been made with a source and drain having a thickness of from about 100 A to 500 A formed by depositing the metal on the substrate at a rate of about 0.1 A to 50 A, and preferably from about 0.7 A to 6 A per second. Very good devices have been made in which both the source and drain are gold having a thickness of from 100 A to 300 A formed by depositing the gold on the substrate at a rate of from 0.7 A to 6 A per second.

After the deposition of a sufficient thickness of the source and drain electrodes has been indicated by the monitoring system 64, a mechanical shutter mechanism 66 is activated to shut off the metal vapor.

The mask changing mechanism 60 is then activated to index the next mask over the substrate and the layer 18 of semiconductor material is vapor deposited between the source and drain electrodes.

The layer 18 of semiconductor material may consist of any semiconductor material selected from the group consisting of tellurium, cadmium sulfide, silicon, cadmium selenide, indium arsenide, gallium arsenide, tin oxide and lead telluride.

Satisfactory devices have been made in which the layer of semiconductor material has a thickness of from 40 A to 200 A and preferably about 100 A when the semiconductor material is tellurium, up to about 5,000 A for the wider band-gap materials as cadmium sulfide and cadmium selenide.

After completion of the deposition of the layer 18, the next mask is indexed into position and layer 20 of doped silicon oxide is vapor deposited over the layer 18 of semiconductor material.

The doped silicon oxide layer may be formed by; (1) co-evaporation; (2) sputtering and (3) by pyrolytic decomposition.

In the co-evaporation method, silicon monoxide is evaporated from a first source while the desired dopant is evaporated from a second source and the oxide and dopant are combined in situ on the layer of semiconductor material.

A quartz crystal microbalance can be used to sense the condensed mass of vapor. This information is fed back to the power source to control the rate of evaporation.

The source of dopant material may be any metal or any compound that will decompose to supply the positive dopant atom and a compatible or at least non-objectionable atom.

For example, if barium is the desired dopant the evaporating source may be barium carbonate, barium oxide or barium metal.

Barium fluoride and barium sulfide are examples of materials which may not be used since they would introduce fluorine or sulfur into the system.

If lead is the desired dopant, pure lead is the most satisfactory evaporation source. If lead carbonate or lead oxide is used, the lead has a tendency to flow to the coolest part of the melt and only the carbonate or oxide ion is given off.

Strontium metal is preferred since the melting point of strontium oxide is very high.

Calcium like barium may be used in the carbonate or oxide form as well as in the pure metal form.

If the layer of doped silicon oxide is to be applied by sputtering a silicon oxide-dopant compound is formed and this compound is sputtered on the semiconductor material.

In the pyrolytic decomposition technique, a halogenated silane with an organic-metallic compound of the dopant are decomposed and deposited.

As discussed hereinabove, the thickness of the layer 20 of doped silicon oxide is dependent on the operating voltage of the device with a thickness of about 300 A to 500 A being a satisfactory minimum. Satisfactory devices have been made employing a doped silicon monoxide layer having a thickness of 300 A to 500 A, the layer having been deposited at a rate of 0.1 to 5 A per second and preferably at a rate of 0.2 A to 2.0 A per second.

The next mask is then indexed into position and the gate electrode 22 is vapor deposited onto layer 20.

The gate electrode or contact 22 consists of an electrically conductive metal selected from the group consisting of aluminum, copper, tin, silver, gold and platinum.

The gate electrode or contact should have a thickness of from about 300 A to 100 A and preferably from 500 A to 1,000 A and for best results should be vapor deposited at a rate of from 3 A to 50 A per second and preferably from about 6 A to 20 A per second.

If desired still another mask may then be indexed into position and the device sealed within a silicon monoxide or similar coating to protect it from the ambient. A coating of silicon monoxide from about 250 A to 100 A has proven satisfactory when deposited at a rate of about 1 A to 3 A per second.

After the completion of the device, the substrate is advanced and the sequence repeated whereby a plurality of devices are formed one after another on the substrate.

In preparing bipolar discrete semiconductor devices and IC device, especially of the planar configuration it is common practice to insulate or passivate the p-n junctions at the point where they intersect a wafer surface with a first layer of silicon oxide and a second layer of silicon nitride.

Figure 13:
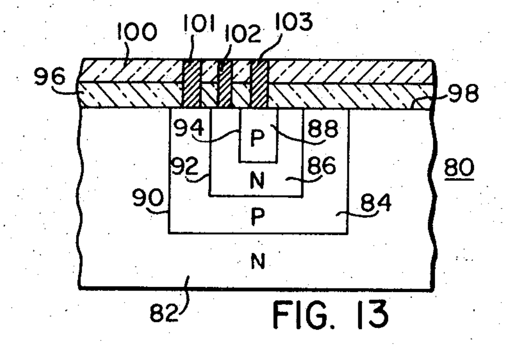
FIGS. 13 and 14 are side views of sections of IC blocks.

FIG. 13 shows a section of a typical planar IC structure 80. The structure 80 comprises a substrate 82 of for example n-type semiconductor material, for example, silicon, a first region 84 of p-type semiconductor material, a second region 86 of n-type semiconductor material and a fourth region of p-type semiconductivity 88. There is a first p-n junction 90 between substrate 82 and region 84; a second p-n junction 92 between regions 84 and 86; and a third p-n type junction 94. There is a first layer 96 of silicon oxide disposed on surface 98 at least where p-n junctions 90, 92 and 94 intersect surface 98. There is also a layer 100 of silicon nitride disposed over layer 96. Windows 101, 102 and 103 are opened in the two layers 96 and 100 to facilitate making contact to the regions 84, 86, and 88.

The layer 100 of silicon nitride is required in such prior art IC structure because of the fact that contaminate ions can migrate through the silicon oxide layer 96.

Figure 14:
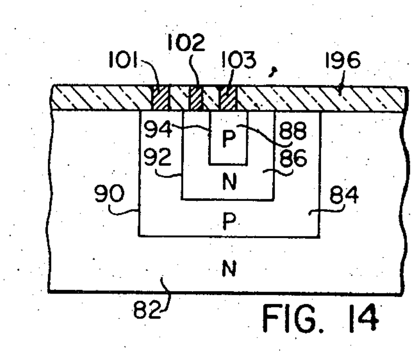

In accordance with the teachings of this invention, and as shown in FIG. 14 wherein all parts having a counterpart in FIG. 13 are designated by the same numbers, the silicon nitride layer 100 is no longer needed. In place of silicon oxide layer 96 and silicon nitride layer 100, the structure has a layer 196 consisting of silicon oxide doped with from 0.1 percent to 20 percent, by volume, and preferably from 0.5 percent to 5 percent, by volume of at least one material which is divalent and has an ionic radii of at least 0.9 A. Suitable divalent materials are barium, lead, strontium, calcium and oxides of these materials.

The layer 196 prevents the migration of contaminate ions to the semiconductor material. Thus the need for a layer of silicon nitride is eleminated.

I claim as my invention:

1. A semiconductor device comprising a body of silicon oxide doped with at least one divalent material selected from the group consisting of barium, lead, strontium, calcium and oxides thereof, and having an atomic radii of at least 0.9 A, said divalent material comprising from 0.1 percent to 20 percent, by volume of the body of silicon oxide, disposed on at least a portion of at least one surface of a body of semiconductor material.

2. The device of claim 1 in which the doping material comprises from 0.5 percent to 5 percent, by volume, of the body of silicon oxide.

3. A field effect transistor comprising a source contact and a drain contact spaced apart and disposed on a substrate, a layer of a semiconductor material disposed between said source and drain contacts and in physical contact therewith, a layer of a doped silicon oxide disposed over at least a portion of said layer of semiconductor material and a gate contact disposed on said layer of doped silicon oxide between said source and drain electrodes, said silicon oxide layer being doped with at least one divalent material, said divalent material being selected from the group consisting of barium, lead, strontium, calcium and oxides thereof, and having an atomic radii of at least 0.9 A said divalent material comprising from 0.1 percent to 20 percent, by volume, of said layer of silicon dioxide.

4. The field effect transistor of claim 3 in which the doping material comprises from 0.5 percent to 5 percent, by volume, of the body of silicon oxide.

5. The field effect transistor of claim 4 in which the doping material is barium oxide.

6. A semiconductor device comprising a body of semiconductor material having at least two adjacent regions of opposite type semiconductivity, a p-n junction between said two adjacent regions, said p-n junction extending to at least one surface of said body of semiconductor material, a layer of doped silicon oxide disposed over at least that portion of the surface where the p-n junction terminates, said silicon oxide layer being doped with from 0.1 percent to 20 percent, by volume, with at least one divalent material selected from the group consisting of barium, lead, strontium, calcium and oxides thereof and said divalent material having an atomic radii of at least 0.9 A.

* * * * *